United States Patent
Ohkubo et al.

(10) Patent No.: US 9,629,289 B2
(45) Date of Patent: Apr. 18, 2017

(54) WIRE HARNESS AND ELECTRIC WIRE HOLDING MEMBER

(71) Applicants: YAZAKI CORPORATION, Tokyo (JP); TOYOTA JIDOSHA KABUSHIKI KAISHA, Toyota-shi, Aichi-ken (JP)

(72) Inventors: Yoshitaka Ohkubo, Shizuoka (JP); Yasuhiro Yamaguchi, Shizuoka (JP); Hiroshi Aihara, Toyota (JP)

(73) Assignees: Yazaki Corporation, Minato-ku, Tokyo (JP); TOYOTA JIDOSHA KABUSHIKI KAISHA, Toyota-shi, Aichi-ken (JP)

( * ) Notice: Subject to any disclaimer, the term of this patent is extended or adjusted under 35 U.S.C. 154(b) by 0 days.

(21) Appl. No.: 15/171,137

(22) Filed: Jun. 2, 2016

(65) Prior Publication Data

US 2016/0366795 A1 Dec. 15, 2016

(30) Foreign Application Priority Data

Jun. 12, 2015 (JP) .................................. 2015-119641

(51) Int. Cl.
*H05K 9/00* (2006.01)
*H01B 7/00* (2006.01)

(52) U.S. Cl.
CPC ......... *H05K 9/0098* (2013.01); *H01B 7/0045* (2013.01)

(58) Field of Classification Search
CPC .................................................. H05K 9/0098
See application file for complete search history.

(56) References Cited

U.S. PATENT DOCUMENTS

| | | | | |
|---|---|---|---|---|
| 2012/0090866 A1* | 4/2012 | Gundel | ............... | H01B 7/0861 174/34 |
| 2012/0312579 A1* | 12/2012 | Kenny | ............... | H01B 11/1008 174/107 |
| 2013/0112473 A1* | 5/2013 | Toyama | ............. | B60R 16/0215 174/350 |
| 2013/0175079 A1* | 7/2013 | Adachi | ............... | B60R 16/0215 174/350 |

(Continued)

FOREIGN PATENT DOCUMENTS

| | | | |
|---|---|---|---|
| JP | 2001136632 | * | 5/2001 |
| JP | 2012-249506 A | | 12/2012 |

*Primary Examiner* — Hung V Ngo
(74) *Attorney, Agent, or Firm* — Sughrue Mion, PLLC (57) ABSTRACT

A wire harness includes an electric wire portion in which three electric wires are collected in the same direction, a braided wire which surrounds the outer circumferential side of the electric wire portion in a bundle, and an electric wire holding member which maintains the arrangement of the electric wires about a center axis line of the electric wire portion. The electric wire holding member includes a plurality of braided correction portions which protrudes in the direction of the center axis line from an inner circumferential surface of the outer shape holding portion between two adjacent electric wires of the electric wire portion in the circumferential direction about the center axis line, and is formed so that the braided wire approaches the center axis line in relation to outer circumferential tangential lines connecting conductor portions of the two electric wires in a cross-section perpendicular to the center axis line.

20 Claims, 5 Drawing Sheets

(56) References Cited

U.S. PATENT DOCUMENTS

| | | | |
|---|---|---|---|
| 2013/0180754 A1* | 7/2013 | Hinoshita | H01B 11/002 174/113 R |
| 2013/0233592 A1* | 9/2013 | Li | H01B 1/24 174/119 R |
| 2013/0248218 A1* | 9/2013 | Glew | H05K 9/0098 174/34 |
| 2014/0299348 A1* | 10/2014 | Daumand | H05K 9/0098 174/107 |

* cited by examiner

WIRE HARNESS AND ELECTRIC WIRE HOLDING MEMBER

CROSS-REFERENCE TO RELATED APPLICATION(S)

The present application claims priority to and incorporates by reference the entire contents of Japanese Patent Application No. 2015-119641 filed in Japan on Jun. 12, 2015.

BACKGROUND OF THE INVENTION

1. Field of the Invention

The present invention relates to a wire harness and an electric wire holding member.

2. Description of the Related Art

In a vehicle such as a hybrid automobile or an electric automobile, an inverter and a motor hitherto are connected to each other by a three-phase electric wire, so that electric power is supplied from the inverter to the motor. In the three-phase electric wire, there is known a so-called bundle shield structure that suppresses noise by coating outer circumferential portions together through one braid (for example, see Japanese Patent Application Laid-open No. 2012-249506).

Incidentally, when electric power is supplied from the inverter to the motor, the output from the inverter includes a steeply rising voltage. The steeply rising voltage is reflected several times between the inverter and the motor due to impedance mismatching. As a result, there is a case in which an excessive surge voltage is applied to the motor. Thus, in the bundle shield structure of the related art disclosed in Japanese Patent Application Laid-open No. 2012-249506, there is a room for further improvement in that the surge voltage needs to be suppressed.

SUMMARY OF THE INVENTION

The present invention is made in view of the above-described circumstances, and an object of the invention is to provide a wire harness and an electric wire holding member capable of appropriately suppressing a surge voltage.

In order to achieve the above mentioned object, a wire harness according to one aspect of the present invention includes an electric wire portion in which three or more electric wires are collected in a same direction, each of the electric wires including a conductor portion and an insulating portion coating an outer circumference of the conductor portion; a shield member which surrounds an outer circumferential side of the electric wire portion in a bundle; and an electric wire holding member which maintains an arrangement of the electric wires about a center axis line of the electric wire portion. Herein, the electric wire holding member includes an outer shape holding portion which surrounds more outer circumferential side of the electric wire portion and the shield member, and a plurality of shield member-shaped correction portions which protrudes in a direction of the center axis line from an inner circumferential surface of the outer shape holding portion between two adjacent electric wires of the electric wire portion along a circumferential direction about the center axis line, and which is formed so that the shield member approaches the center axis line side in relation to an outer circumferential tangential line connecting the conductor portions of two electric wires in a cross-section when viewed from an axial direction along the center axis line.

According to another aspect of the present invention, in the wire harness, it is preferable to configure that a front end of the shield member-shaped correction portion is circular in the cross-section.

According to still another aspect of the present invention, in the wire harness, it is preferable to configure that the electric wires of the electric wire portion are circular in the cross-section and are disposed at a same interval in the circumferential direction, and the shield member-shaped correction portion of the electric wire holding member is formed so that the shield member approaches the center axis line side in relation to a line connecting center points of two electric wires between the two adjacent electric wires of the electric wire portion in the circumferential direction in the cross-section.

According to still another aspect of the present invention, in the wire harness, it is preferable to configure that the shield member-shaped correction portion of the electric wire holding member is formed so that the shield member approaches the center axis line from a gap between the two electric wires and surrounds the outer circumferential side of the electric wire of the electric wire portion in the cross-section.

According to still another aspect of the present invention, in the wire harness, it is preferable to configure that the shield member is a braided wire obtained by weaving a thin metallic wire in a mesh shape.

According to still another aspect of the present invention, in the wire harness, it is preferable to configure that the shield member is grounded.

According to still another aspect of the present invention, in the wire harness, it is preferable to configure that the electric wire holding members are formed so as to surround a part of the electric wire portion in a longitudinal direction and are provided at a predetermined interval along the longitudinal direction of the electric wire portion.

According to still another aspect of the present invention, in the wire harness, it is preferable to configure that the electric wire holding member is formed so as to surround an entire area of the electric wire portion in a longitudinal direction.

Similarly, in order to achieve the above mentioned object, an electric wire holding member according to still another aspect of the present invention includes an outer shape holding portion which surrounds more outer circumferential side of an electric wire portion and a shield member, the electric wire portion in which three or more electric wires being collected in a same direction, each of the electric wires including a conductor portion and an insulating portion coating an outer circumference of the conductor portion, the shield member surrounding an outer circumferential side of the electric wire portion in a bundle; and a plurality of shield member-shaped correction portions which protrudes in a direction of a center axis line from an inner circumferential surface of the outer shape holding portion between two adjacent electric wires of the electric wire portion along a circumferential direction about the center axis line of the electric wire portion, and which is formed so that the shield member approaches the center axis line side in relation to an outer circumferential tangential line connecting the conductor portions of the two electric wires in a cross-section when viewed from an axial direction along the center axis line.

The above and other objects, features, advantages and technical and industrial significance of this invention will be better understood by reading the following detailed descrip-

DETAILED DESCRIPTION OF THE PREFERRED EMBODIMENTS

Hereinafter, a wire harness and an electric wire holding member according to an embodiment of the invention will be described with reference to the drawings. Furthermore, in the drawings below, the same reference numerals will be given to the same or equivalent components and the description thereof will not be repeated.

Embodiment

Figure 1:
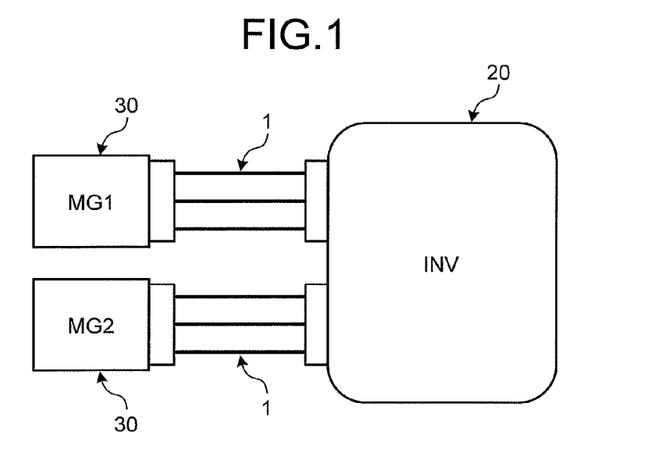
FIG. 1 is a schematic diagram illustrating the configuration of connecting a motor and an inverter to each other by a wire harness according to an embodiment of the invention.
Figure 2:
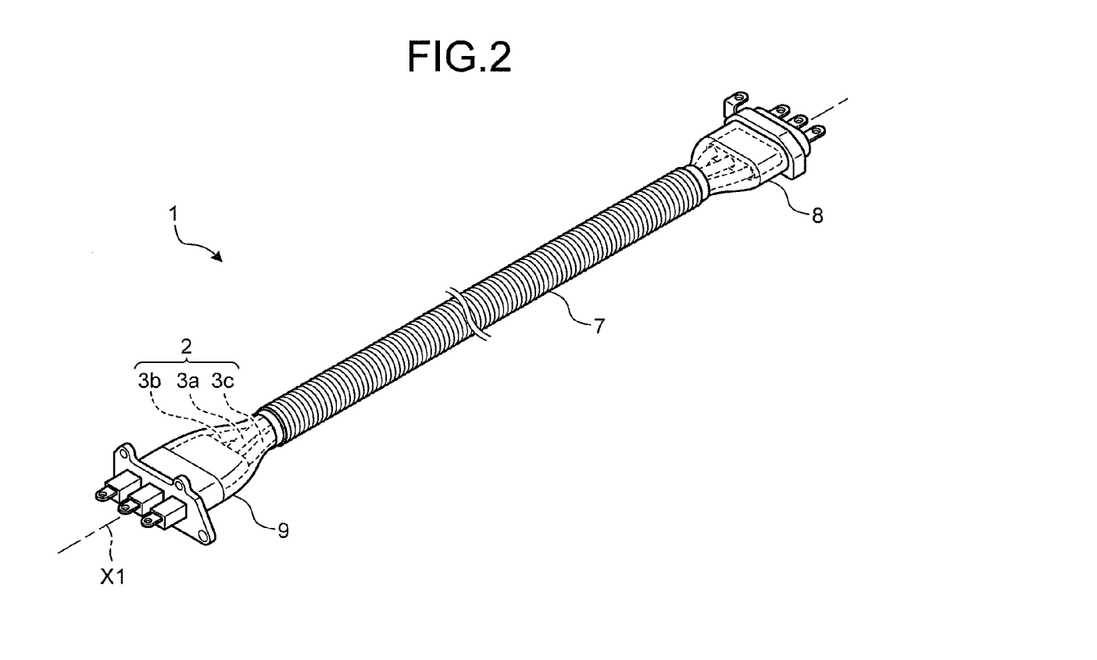
FIG. 2 is a perspective view of the wire harness according to the embodiment of the invention.
Figure 3:
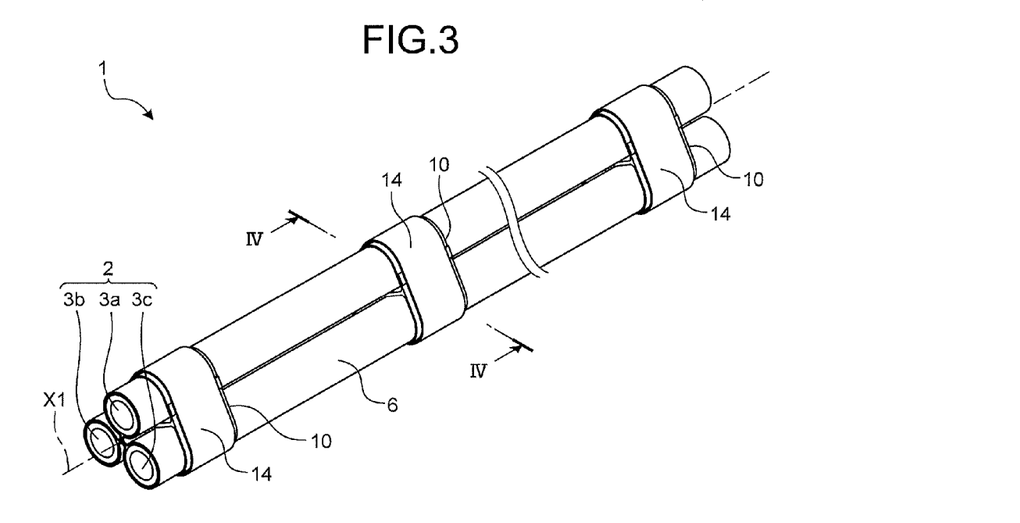
FIG. 3 is a perspective view illustrating the configuration of a part coated by a corrugate tube in the wire harness illustrated in FIG. 2.
Figure 4:
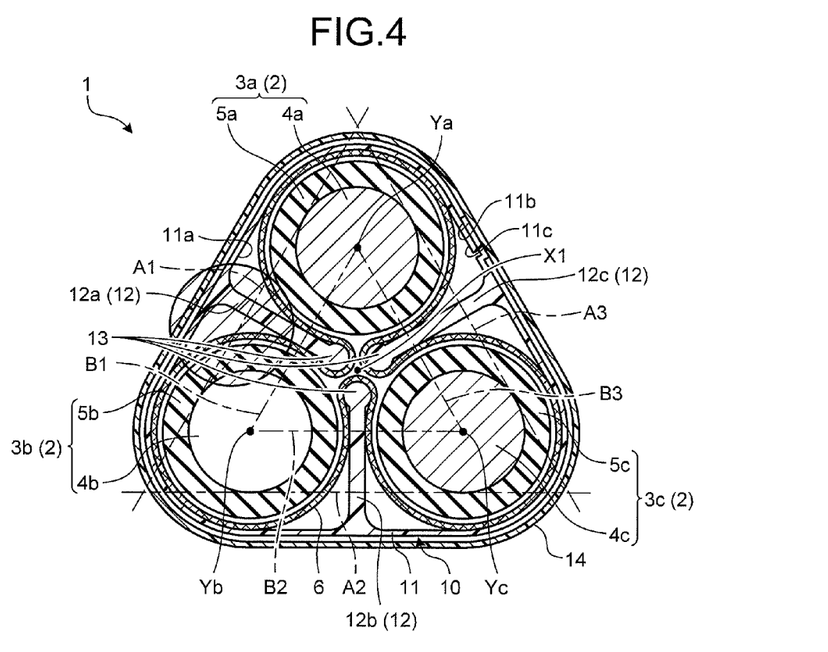
FIG. 4 is a cross-sectional view taken along the line IV-IV of FIG. 3 and is an axial cross-sectional view of the wire harness according to the embodiment of the invention.
Figure 5:
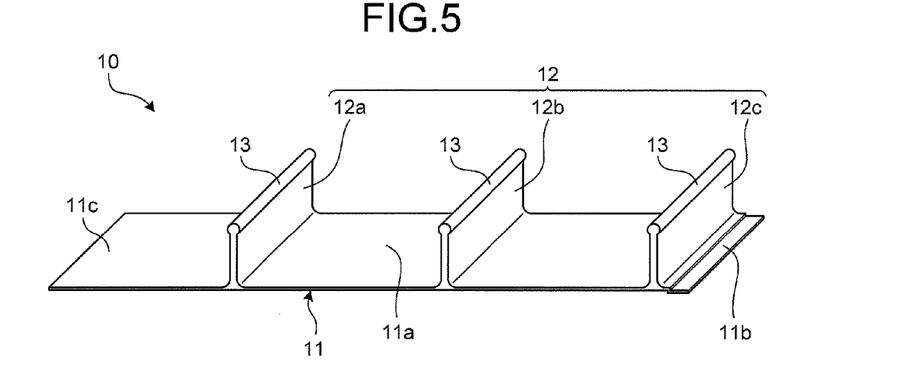
FIG. 5 is a perspective illustrating a state where an electric wire holding member illustrated in FIGS. 3 and 4 is exploded.

Referring to FIGS. 1 to 5, the configurations of a wire harness 1 and an electric wire holding member 10 according to an embodiment will be described. FIG. 1 is a schematic diagram illustrating the configuration of connecting a motor and an inverter to each other by a wire harness according to an embodiment of the invention. FIG. 2 is a perspective view of the wire harness according to the embodiment of the invention. FIG. 3 is a perspective view illustrating the configuration of a part coated by a corrugate tube in the wire harness illustrated in FIG. 2. FIG. 4 is a cross-sectional view taken along the line IV-IV of FIG. 3 and is an axial cross-sectional view of the wire harness according to the embodiment of the invention. FIG. 5 is a perspective illustrating a state where an electric wire holding member illustrated in FIGS. 3 and 4 is exploded.

An inverter 20 (indicated by "INV" in FIG. 1) and a motor 30 (indicated by "MG1" and "MG2" in FIG. 1) illustrated in FIG. 1 are mounted on a vehicle such as a hybrid automobile or an electric automobile. The inverter 20 is a device that converts a DC output from a power supply (not illustrated) mounted on the vehicle into a three-phase AC output. The inverter 20 may be used to output a PWM waveform, but may also be used to output a sine waveform. The motor 30 is a device which is driven by a three-phase AC output from the inverter 20. For example, the motor is a star-connection three-phase motor.

The wire harness 1 according to the embodiment is used as a power supply line connecting the three-phase AC type inverter 20 to the motor 30. The wire harness 1 is a three-phase electric wire including a three-phase electric wire group that supplies three-phase AC power by using three electric wires 3a, 3b, and 3c (see FIGS. 2 to 4).

As illustrated in FIG. 2, the wire harness 1 has a configuration in which an inverter side connector 8 and a motor side connector 9 to be respectively connected to the inverter 20 and the motor 30 are respectively connected to both terminals of an electric wire portion 2, where three electric wires 3a, 3b, and 3c are collected in a bundle in the same direction. Further, as illustrated in FIGS. 2 and 3, the wire harness 1 coats the outer circumferential side of the electric wire portion 2 in order of a tubular braided wire 6 (a shield member), the electric wire holding member 10, and a tubular corrugate tube 7.

As illustrated in FIGS. 3 and 4, three electric wires 3a, 3b, and 3c of the electric wire portion 2 extend along a predetermined center axis line X1 while being disposed at the same interval about the center axis line X1 in the circumferential direction. Three electric wires 3a, 3b, and 3c are respectively non-shield type electric wires, and respectively include conductor portions 4a, 4b, and 4c each having a circular cross-section and insulating portions 5a, 5b, and 5c formed by coating the outer circumferential portions of the conductor portions 4a, 4b, and 4c. That is, each shape of the electric wires 3a, 3b, and 3c is substantially circular in the cross-section of the wire harness 1 (the axial cross-section, that is, the cross-section perpendicular to the center axis line X1) when viewed from the axial direction along the center axis line X1 illustrated in FIG. 4. The conductor portions 4a, 4b, and 4c of the electric wires 3a, 3b, and 3c are formed by twisting, for example, a plurality of thin wires of metal (aluminum alloy or copper alloy) in a spiral shape or formed by a rod-shaped solid wire. The insulating portions 5a, 5b, and 5c of the electric wires 3a, 3b, and 3c are formed of, for example, synthetic resin.

The electric wires 3a, 3b, and 3c of the electric wire portion 2 are disposed in a so-called trefoil shape in which axes (center points) Ya, Yb, and Yc form an equilateral triangle shape in the axial cross-section illustrated in FIG. 4. Further, three electric wires 3a, 3b, and 3c are disposed so that two electric wires adjacent to each other in the circumferential direction about the center axis line X1 do not contact each other while having a gap therebetween. The electric wire portion 2 can be bent since the conductor portions 4a, 4b, and 4c and the insulating portions 5a, 5b, and 5c of the electric wires 3a, 3b, and 3c have plasticity.

The braided wire 6 is formed by weaving thin wires (thin metallic wires) formed of metal (for example, copper) in a mesh shape so that a tubular shape is formed on the whole. The braided wire 6 which surrounds the outer circumferential side of the electric wire portion 2 in a bundle serves as a shield member that suppresses noise. The braided wire 6 can be expanded and contracted due to the plasticity of the thin wire and hence can be bent together with the electric wire portion 2. Further, the braided wire 6 is grounded.

Then, particularly in the embodiment, as illustrated in FIG. 4, the braided wire 6 for three electric wires 3a, 3b, and 3c of the electric wire portion 2 has a characteristic shape. In the wire harness 1 of the embodiment, the braided wire 6 and three electric wires 3a, 3b, and 3c of the electric wire portion 2 are disposed alternately in the circumferential direction about the center axis line X1 of the electric wire portion 2. In other words, the braided wire 6 is interposed between two electric wires adjacent to each other in the circumferential direction among three electric wires 3a, 3b, and 3c equally arranged while being separated from one another in the circumferential direction about the center axis line X1. That is, the braided wire 6 is interposed between two electric wires adjacent to each other in the circumferential direction among three electric wires 3a, 3b, and 3c of the electric wire portion 2.

More specifically, as illustrated in FIG. 4, in the cross-section of the wire harness 1 when viewed from the axial direction along the center axis line X1, (1) the braided wire 6 is formed so as to surround the outer circumferential side of the electric wire portion 2 in a bundle. Furthermore, (2) three electric wires 3a, 3b, and 3c of the electric wire portion 2 and the braided wire 6 are disposed so that the braided wire 6 is interposed between two adjacent electric wires of the electric wire portion 2 in the circumferential direction about the center axis line X1 of the electric wire portion 2 while the braided wire is close to the center axis line X1 in relation to the outer circumferential tangential line connecting the conductor portions of two electric wires. To be more specific, in the configuration (2), the braided wire 6 approaches the center axis line X1 in relation to the outer circumferential tangential line Al contacting the outer circumferential side of the conductor portion 4a of the electric wire 3a and the conductor portion 4b of the electric wire 3b between the electric wire 3a and the electric wire 3b adjacent to each other in the circumferential direction of the electric wire portion 2. Similarly, the braided wire 6 approaches the center axis line X1 in relation to the outer circumferential tangential line A2 contacting the outer circumferential side of the conductor portion 4b of the electric wire 3b and the conductor portion 4c of the electric wire 3c between the electric wire 3b and the electric wire 3c adjacent to each other in the circumferential direction of the electric wire portion 2. Similarly, the braided wire 6 approaches the center axis line X1 in relation to the outer circumferential tangential line A3 contact the outer circumferential side of the conductor portion 4c of the electric wire 3c and the conductor portion 4a of the electric wire 3a between the electric wire 3c and the electric wire 3a adjacent to each other in the circumferential direction of the electric wire portion 2.

Still more specifically, in the cross-section of the wire harness 1 illustrated in FIG. 4, (1) the braided wire is formed so as to surround the outer circumferential side of the electric wire portion 2 in a bundle. Further, (3) the braided wire 6 is formed so as to approach the center axis line X1 in relation to the line connecting the center points of two electric wires between two adjacent electric wires of the electric wire portion 2 in the circumferential direction. To be more specific, in the configuration (3), the braided wire 6 approaches the center axis line X1 in relation to the line B1 connecting the center point Ya of the electric wire 3a and the center point Yb of the electric wire 3b between the electric wire 3a and the electric wire 3b adjacent to each other in the circumferential direction. Similarly, the braided wire 6 approaches the center axis line X1 in relation to the line B2 connecting the center point Yb of the electric wire 3b and the center point Yc of the electric wire 3c between the electric wire 3b and the electric wire 3c adjacent to each other in the circumferential direction. Similarly, the braided wire 6 approaches the center axis line X1 in relation to the line B3 connecting the center point Yc of the electric wire 3c and the center point Ya of the electric wire 3a between the electric wire 3c and the electric wire 3a adjacent to each other in the circumferential direction.

Still more specifically, in the cross-section of the wire harness 1 illustrated in FIG. 4, (4) the braided wire 6 is formed so as to approach the center axis line X1 from a gap between two adjacent electric wires of the electric wire portion 2 in the circumferential direction and to surround the outer circumferential side of each of the electric wires 3a, 3b, and 3c of the electric wire portion 2.

The electric wire holding member 10 is a member that further surrounds the electric wire portion 2 and the braided wire 6 surrounding the outer circumferential side of the electric wire portion 2 in a bundle from the outer circumferential side. As described above, the embodiment is characterized in the configurations (1) to (4) in which the electric wire portion 2 is coated by the braided wire 6. Here, since the electric wire holding member 10 is provided at the outer circumferential side of the electric wire portion 2 and the braided wire 6, the arrangement of the electric wires 3a, 3b, and 3c of the electric wire portion 2 about the center axis line X1 is maintained, and the coating shape of the braided wire 6 for the electric wire portion 2 can be maintained as in the configurations (1) to (4). The electric wire holding member 10 is formed of, for example, synthetic resin.

As illustrated in FIGS. 4 and 5, the electric wire holding member 10 includes an outer shape holding portion 11 and a plurality of braided correction portions 12 (12a, 12b, and 12c) (shield member-shaped correction portions). The outer shape holding portion 11 surrounds the outer circumferential side of the electric wire portion 2 and the braided wire 6. As illustrated in FIG. 5, the outer shape holding portion 11 is a substantially rectangular sheet member and is formed so as to surround the outer circumferential side about the center axis line X1 of the electric wire portion 2. Further, the long side of the outer shape holding portion 11 has a dimension capable of sufficiently surrounding the electric wire portion 2, and the short side of the outer shape holding portion 11 has a dimension capable of partially coating the electric wires 3a, 3b, and 3c of the electric wire portion 2 in the longitudinal direction (see also FIG. 3). Further, one end of the outer shape holding portion 11 in the long side direction is provided with a step portion 11b which is recessed from one principal surface 11a (which is a surface contacting the electric wire portion 2 when being wound around the electric wire portion 2 and hereinafter will be also referred to as an "inner circumferential surface 11a") formed throughout the entire area in the short side direction toward the other principal surface. The step amount of the step portion 11b is substantially equal to the thickness of the outer shape holding portion 11. The outer shape holding portion 11 can completely surround the outer circumferential side of the electric wire portion 2 while being wound around the electric wire portion 2 so that an end 11c opposite to the step portion 11b in the long side direction abuts against the step portion 11b.

As illustrated in FIG. 5, each of the braided correction portions 12 is a plate-shaped member that is formed upright from the inner circumferential surface 11a of the outer shape holding portion 11 so as to extend in the short side direction. The braided correction portions 12 are disposed at the same interval in the long side direction of the outer shape holding portion 11. The number of the braided correction portions 12 is equal to the number of the electric wires of the electric wire portion 2. In the embodiment, three braided correction portions 12a, 12b, and 12c are disposed on the inner circumferential surface 11a of the outer shape holding portion 11 at the same interval in the long side direction. The braided correction portions 12a, 12b, and 12c are formed so as to protrude in the direction of the center axis line X1 from the inner circumferential surface 11a of the outer shape holding portion 11 while the electric wire holding member 10 is wound on the outer circumferential side of the electric wire portion 2 as illustrated in FIG. 4.

The height dimensions and the gaps of the braided correction portions 12a, 12b, and 12c are set so that the braided correction portions 12a, 12b, and 12c are respectively inserted between two adjacent electric wires of the electric wire portion 2 in the circumferential direction about the center axis line X1 of the electric wire portion 2 while the electric wire holding member 10 is wound on the outer circumferential side of the electric wire portion 2 and the front end 13 reaches a position (in the embodiment, (4), that is, the position of the center axis line X1) satisfying any one of the coating structures (2) to (4) in which the electric wire portion 2 is coated by the braided wire 6. In the embodiment, as illustrated in FIG. 4, the braided correction portion 12a is formed so that the braided correction portion is inserted between the electric wire 3a and the electric wire 3b adjacent to each other in the circumferential direction and the front end 13 reaches the center axis line X1. Similarly, the braided correction portion 12b is formed so that the braided correction portion is inserted between the electric wire 3b and the electric wire 3c adjacent to each other in the circumferential direction and the front end 13 reaches the center axis line X1. Similarly, the braided correction portion 12c is formed so that the braided correction portion is inserted between the electric wire 3c and the electric wire 3a adjacent to each other in the circumferential direction and the front end 13 reaches the center axis line X1.

Accordingly, the braided correction portion 12 is configured so that the braided wire 6 disposed between the electric wire portion 2 and the electric wire holding member 10 approaches a position (in the embodiment, (4), that is, the position of the center axis line X1) satisfying any one of the coating structures (2) to (4), in which the electric wire portion 2 is coated by the braided wire 6, between two adjacent electric wires of the electric wire portion 2 in the circumferential direction about the center axis line X1 of the electric wire portion 2 when the electric wire holding member 10 surrounds the outer circumferential side of the electric wire portion 2.

The front end 13 of each of the braided correction portions 12a, 12b, and 12c has a circular shape in the cross-section when viewed from the axial direction along the center axis line X1. Accordingly, the front end 13 is formed so that the braided wire 6 is not damaged by the front end 13 when the braided wire 6 is pressed toward the center axis line X1 while the electric wire holding member 10 surrounds the outer circumferential side of the electric wire portion 2. Furthermore, the "circular shape" used herein does not need to be a true circular shape, and also includes a convex curve shape without a corner.

According to the electric wire holding member 10 with such a configuration, in the wire harness 1 of the embodiment, as illustrated in FIG. 3, the electric wire holding members 10 are provided at a predetermined interval in the extension direction of the electric wires 3a, 3b, and 3c of the electric wire portion 2 (the direction of the center axis line X1). Each electric wire holding member 10 is formed so that the longitudinal dimension of the electric wire (the dimension of the outer shape holding portion 11 in the short side direction) is set to a length in which a part of the electric wire portion 2 in the longitudinal direction is surrounded.

The corrugate tube 7 is formed of synthetic resin so as to have, for example, a bellows shape. Accordingly, the corrugate tube is elastically deformable and the tubular shape is satisfactorily maintained by the elastic restoration force. The corrugate tube 7 is formed so as to accommodate the electric wire portion 2 coated by the braided wire 6 in a tubular shape. Accordingly, the corrugate tube 7 is formed so as to protect the electric wire while coating the outer circumferential side of the electric wire portion 2.

The wire harness 1 of the embodiment with the above-described configuration can be assembled, for example, according to the following steps (i) to (vi).

(i) First, as illustrated in FIG. 5, the electric wire holding members 10 are placed on one flat surface while the outer shape holding portions 11 are exploded so that the inner circumferential surfaces 11a face the upside. At this time, the electric wire holding members 10 are disposed at a predetermined interval in the extension direction of the braided correction portions 12a, 12b, and 12c (the short side direction of the outer shape holding portion 11). Further, the electric wire holding members 10 are disposed so that the positions of the braided correction portions 12a, 12b, and 12c are aligned. The number of the electric wire holding members 10 is set in response to the length of the electric wire portion 2.

(ii) Next, the braided wire 6 is placed on the electric wire holding members 10 placed on one flat surface in the step (i) above. The braided wire 6 is formed in a size in which all electric wire holding members 10 are covered.

(iii) Next, the electric wires 3a, 3b, and 3c are placed on the braided wire 6 in the extension direction of the braided correction portions 12a, 12b, and 12c in the step (ii) above. More specifically, the electric wire 3a is placed between the end 11c of the outer shape holding portion 11 and the braided correction portion 12a, the electric wire 3b is placed between the braided correction portion 12a and the braided correction portion 12b, and the electric wire 3c is placed between the braided correction portion 12b and the braided correction portion 12c.

(iv) Next, the outer shape holding portion 11 is rounded in a direction in which the front ends 13 of the braided correction portions 12a, 12b, and 12c are collected in the electric wire holding members 10 placed as in the step (iii) above, so that the step portion 11b is superimposed on the outer circumferential side of the end 11c and the outer shape holding portion 11 surrounds the electric wire portion 2.

(v) Next, as illustrated in FIG. 3, a tape 14 is wound on the outer circumference of the outer shape holding portion 11 surrounding the electric wire portion 2 in the step (iv) above, and the electric wire holding member 10 is fixed around the electric wire portion 2 and the braided wire 6. Since the tape 14 is wound on the outer circumference, it is possible to prevent a problem in which the outer shape holding portion 11 of the electric wire holding member 10 is opened so as to be separated from the outer circumference of the electric wire portion 2. At this time, the electric wires 3a, 3b, and 3c of the electric wire portion 2 are disposed at the same interval around the center axis line X1. Further, the electric wire holding members 10 are formed so as to surround a part of the electric wire portion 2 in the longitudinal direction and are provided at a predetermined interval in the longitudinal direction of the electric wire portion 2.

(vi) Next, as illustrated in FIG. 2, the corrugate tube 7 is further attached to the outer circumference of the electric wire portion 2 to which the electric wire holding member 10 is fixed in the step (v) above and the connectors 8 and 9 are connected to both ends of the electric wire portion 2, thereby assembling the wire harness 1.

Next, the effect of the wire harness 1 and the electric wire holding member 10 according to the embodiment will be described.

Figure 9:
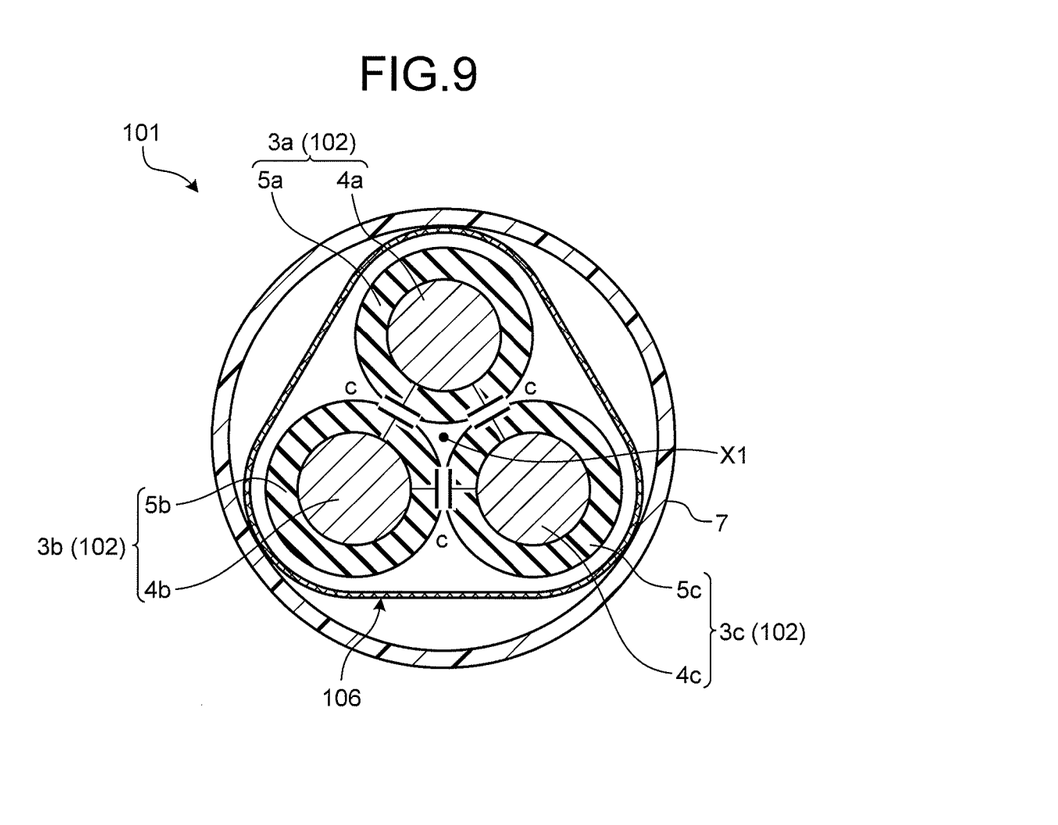
FIG. 9 is an axial cross-sectional view of a wire harness in a bundle shield structure of a wire harness of the related art.

Here, a bundle shield structure of a wire harness 101 of the related art will be described as a comparative example, with reference to FIG. 9. FIG. 9 is an axial cross-sectional view of a wire harness in the bundle shield structure of the wire harness of the related art.

As illustrated in FIG. 9, the wire harness 101 of the related art includes an electric wire portion 102, a braided wire 106, and a corrugate tube 7, similarly to the wire harness 1 of the embodiment.

The electric wire portion 102 includes three electric wires 3a, 3b, and 3c similarly to the electric wire portion 2 of the wire harness 1 of the embodiment. The electric wires 3a, 3b, and 3c are disposed in a trefoil shape in the axial cross-section illustrated in FIG. 9. Further, in the electric wires 3a, 3b, and 3c, two adjacent electric wires in the circumferential direction about the center axis line X1 are contactable. The materials or the properties of the conductor portions 4a, 4b, and 4c and the insulating portions 5a, 5b, and 5c constituting the electric wires 3a, 3b, and 3c are similar to those of the wire harness 1 of the embodiment.

The braided wire 106 is formed in a tubular shape while having the same material and property as those of the braided wire 6 of the wire harness 1 of the embodiment, and surrounds the outer circumferential side of the electric wire portion 102 in a bundle similarly to the braided wire 6. On the other hand, the braided wire 106 is different from the braided wire 6 of the wire harness 1 of the embodiment in that the braided wire does not enter between two adjacent electric wires of the electric wire portion 102 as illustrated in FIG. 9.

When such a wire harness 101 is connected between the inverter 20 and the motor 30 so that electric power is supplied therebetween (see FIG. 1), the distance between the electric wires of the electric wires 3a, 3b, and 3c of the electric wire portion 102 is short. For this reason, the capacitance c among the electric wires 3a, 3b, and 3c increases, and hence noise is easily generated in the electric wires 3a, 3b, and 3c. Further, since the distance between the electric wires of the electric wires 3a, 3b, and 3c is short, the electric wires 3a, 3b, and 3c are easily influenced by the noise generated between the adjacent electric wires. For this reason, when noise is generated in the electric wires 3a, 3b, and 3c, there is a tendency that the radiation noise of the electric wire portion 102 increases. As a result, there is a case in which an excessive surge voltage is generated.

On the contrary, the wire harness 1 according to the embodiment includes the electric wire portion 2 in which three electric wires 3a, 3b, and 3c respectively including the conductor portions 4a, 4b, and 4c and the insulating portions 5a, 5b, and 5c coating the outer circumferences of the conductor portions 4a, 4b, and 4c are collected in the same direction, the braided wire 6 which surrounds the outer circumferential side of the electric wire portion 2 in a bundle, and the electric wire holding member 10 which maintains the arrangement of the electric wires 3a, 3b, and 3c about the center axis line X1 of the electric wire portion 2.

The electric wire holding member 10 according to the embodiment includes the outer shape holding portion 11 and the braided correction portions 12a, 12b, and 12c. The outer shape holding portion 11 further surrounds the outer circumferential side of the electric wire portion 2 in which three electric wires 3a, 3b, and 3c are collected in the same direction and the braided wire 6 which surrounds the outer circumferential side of the electric wire portion 2 in a bundle. The braided correction portions 12a, 12b, and 12c protrude in the direction of the center axis line X1 of the electric wire portion 2 from the inner circumferential surface 11a of the outer shape holding portion 11 between two adjacent electric wires of the electric wire portion 2 in the circumferential direction about the center axis line X1 of the electric wire portion 2 among the electric wires 3a, 3b, and 3c of the electric wire portion 2. Here, in the cross-section when viewed from the axial direction along the center axis line X1, the braided wire 6 approaches toward the center axis line X1 in relation to the outer circumferential tangential lines A1, A2, and A3 connecting the conductor portions 4a, 4b, and 4c of two electric wires.

With such a configuration, since the braided wire 6 is essentially interposed between two adjacent electric wires in the circumferential direction among the electric wires 3a, 3b, and 3c of the electric wire portion 2, at least a half of a portion in which the electric wires directly face each other can be shielded by the braided wire 6. Accordingly, the capacitance c among the electric wires 3a, 3b, and 3c of the electric wire portion 2 can be reduced. Thus, the generation of the noise in the electric wires 3a, 3b, and 3c can be suppressed and the influence of the noise generated in the adjacent electric wires can be reduced. Further, since the braided wire 6 is interposed among the electric wires 3a, 3b, and 3c, a gap between the adjacent electric wires in the circumferential direction needs to be provided. Thus, the distance between the electric wires increases compared with the wire harness 101 of the related art. For this reason, the influence of the noise generated between the adjacent electric wires can be further reduced. Accordingly, the wire harness 1 of the embodiment can sufficiently reduce the radiation noise of the electric wire portion 2. As a result, the generation of the surge voltage can be appropriately suppressed.

Further, since the electric wire holding member 10 of the embodiment is attached to the outer circumferential side of the electric wire portion 2 and the braided wire 6, it is possible to maintain a state where the braided wire 6 is inserted between the electric wires of the electric wire portion 2 by the braided correction portions 12a, 12b, and 12c protruding toward the inner circumferential side. That is, it is possible to appropriately maintain the shape of the braided wire 6 capable of appropriately suppressing the generation of the surge voltage or the appropriate positional relation among the electric wires 3a, 3b, and 3c of the electric wire portion 2 and the braided wire 6 as described above. Accordingly, the electric wire holding member 10 of the embodiment can maintain the surge voltage suppressing effect in the wire harness 1 in which the electric wire holding member 10 is assembled for a long period of time.

Further, in the electric wire holding member 10 according to the embodiment, each front end 13 of the braided correction portions 12a, 12b, and 12c has a circular cross-section when viewed from the axial direction along the center axis line X1. When the electric wire holding member 10 is wound on the circumferences of the electric wire portion 2 and the braided wire 6, the front ends 13 of the braided correction portions 12a, 12b, and 12c press the braided wire 6 among the electric wires. In the embodiment, since the front end 13 has a circular shape as in the above-described configuration, the front end 13 does not easily get a resistance from the braided wire 6. Accordingly, it is possible to smoothly perform an operation in which the braided wire 6 is pressed among the electric wires by the braided correction portions 12a, 12b, and 12c and to suppress the damage of the braided wire 6 due to this operation.

Further, in the wire harness 1 according to the embodiment, the electric wires 3a, 3b, and 3c of the electric wire portion 2 are circular in the cross-section of the wire harness 1 illustrated in FIG. 4 and are equally disposed in the circumferential direction. The braided correction portions 12a, 12b, and 12c of the electric wire holding member 10 are formed so that the braided wire 6 approaches the center axis line X1 in relation to the lines B1, B2, and B3 connecting the center points of two electric wires between two adjacent electric wires in the circumferential direction among the electric wires 3a, 3b, and 3c of the electric wire portion 2 in the cross-section of the wire harness 1 illustrated in FIG. 4.

With this configuration, since a half or more of a portion in which two adjacent electric wires in the circumferential direction directly face each other among the electric wires 3a, 3b, and 3c of the electric wire portion 2 can be shielded by the braided wire 6, the capacitance c among the electric wires 3a, 3b, and 3c of the electric wire portion 2 can be reduced to almost zero. Thus, the generation of the noise of the electric wires 3a, 3b, and 3c can be reliably suppressed and the influence of the noise of the adjacent electric wires can be reliably reduced. Accordingly, the radiation noise of the electric wire portion 2 can be reliably reduced and hence the generation of the surge voltage can be more reliably suppressed.

Further, in the wire harness 1 according to the embodiment, the braided correction portions 12a, 12b, and 12c of the electric wire holding member 10 are formed so that the braided wire 6 approaches the center axis line X1 from a gap between two adjacent electric wires of the electric wire portion 2 in the circumferential direction and surrounds the outer circumferential side of the electric wires 3a, 3b, and 3c of the electric wire portion 2, in the cross-section of the wire harness 1 illustrated in FIG. 4. With this configuration, since the electric wires 3a, 3b, and 3c of the electric wire portion 2 are individually coated by the braided wire 6, the capacitance c among the electric wires 3a, 3b, and 3c of the electric wire portion 2 can be made to zero. Accordingly, the generation of the noise of the electric wires 3a, 3b, and 3c can be more reliably suppressed and the influence of the noise of the adjacent electric wires can be shielded. As a result, the generation of the surge voltage can be more reliably suppressed.

Further, in the wire harness 1 according to the embodiment, the braided wire 6 obtained by weaving a thin metallic wire in a mesh shape is used as a shield member. According to this configuration, since the braided wire 6 can be expanded and contracted due to the mesh shape, the electric wire portion 2 can be easily coated and the bendability of the wire harness 1 can be maintained.

Here, the wire harness 1 according to the embodiment has a configuration in which the braided wire 6 is interposed among the electric wires 3a, 3b, and 3c of the electric wire portion 2, and the electric wires 3a, 3b, and 3c are disposed so as to face the braided wire 6 in the circumferential direction. For this reason, since the distance between each of the electric wires 3a, 3b, and 3c and the braided wire 6 is shortened, noise is easily generated among the electric wires 3a, 3b, and 3c and the braided wire 6. On the contrary, in the wire harness 1 according to the embodiment, since the braided wire 6 is grounded, the noise can be released from the grounded braided wire 6. Further, since the charging area among the electric wires 3a, 3b, and 3c and the braided wire 6 increases, the capacitance c among the electric wires 3a, 3b, and 3c and the braided wire 6 increases, and hence the noise among the electric wires 3a, 3b, and 3c and the braided wire 6 easily passes. That is, the noise generated among the electric wires 3a, 3b, and 3c and the braided wire 6 can be further absorbed by the braided wire 6. Accordingly, the radiation noise of the electric wire portion 2 can be further reduced and hence the generation of the surge voltage can be further suppressed.

Further, in the wire harness 1 according to the embodiment, the electric wire holding members 10 are provided at a predetermined interval in the longitudinal direction of the electric wire portion 2 so as to surround a part of the electric wire portion 2 in the longitudinal direction. With this configuration, since an area in which the electric wire portion 2 is surrounded by the electric wire holding member 10 can be narrowed to a portion in the longitudinal direction, the plasticity (bendability) of the electric wire portion 2 in which the electric wire holding member 10 is not surrounded can be maintained. Accordingly, the wire harness 1 of the embodiment can satisfactorily maintain the plasticity of the electric wire portion 2 while exhibiting a surge voltage reduction effect by the installation of the electric wire holding member 10.

MODIFIED EXAMPLE

Figure 6:
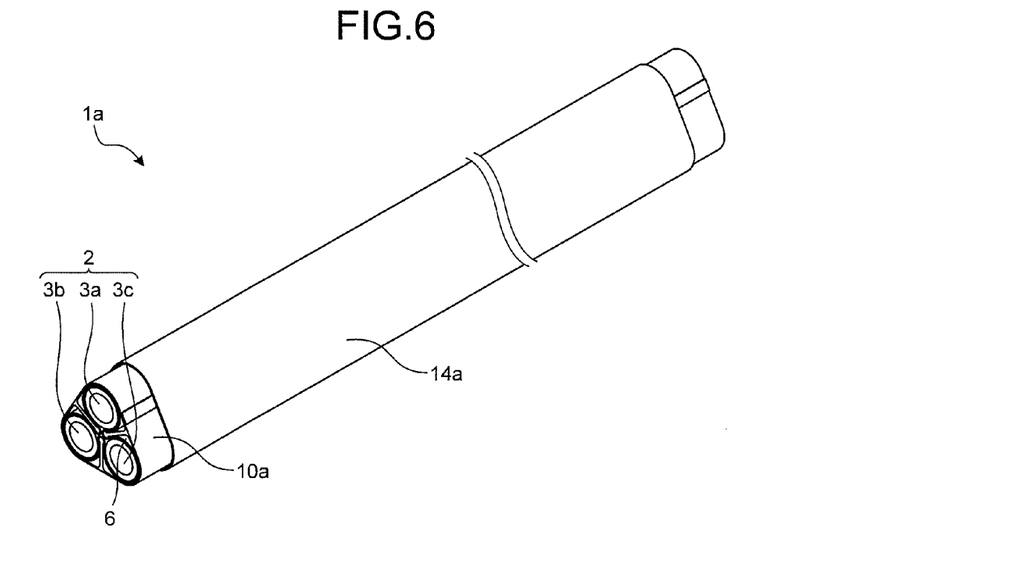
FIG. 6 is a perspective view of a wire harness according to a first modified example of the embodiment.

Next, modified examples of the embodiment will be described with reference to FIGS. 6 to 8. FIG. 6 is a perspective view of a wire harness according to a first modified example of the embodiment. In the above-described embodiment, as illustrated in FIG. 3, a configuration is exemplified in which the wire harness 1 includes the electric wire holding members 10 and each electric wire holding member 10 surrounds a part of the electric wire portion 2 in the longitudinal direction. However, the configuration of the electric wire holding member 10 is not limited thereto. For example, as illustrated in the first modified example of FIG. 6, a wire harness 1a includes a single electric wire holding member 10a, and the electric wire holding member 10a is formed so as to surround the entire area of the electric wire portion 2 in the longitudinal direction. With this configuration, since the contact area between the electric wire holding member 10a and the electric wire portion 2 can be increased, it is possible to more rigidly maintain the shape of the braided wire 6 capable of appropriately suppressing the generation of the surge voltage or the arrangement of the electric wires 3a, 3b, and 3c of the electric wire portion 2 and the braided wire 6. Accordingly, the surge voltage suppressing effect of the wire harness 1a can be maintained for a longer period of time. Further, since the first modified example has a configuration in which the entire area of the electric wire portion 2 in the longitudinal direction is surrounded by the electric wire holding member 10a and a tape 14a is wound on the entire area on the outer circumferential side, the electric wire portion 2 with this configuration is appropriately protected and hence a function similar to the corrugate tube 7 can be exhibited. For this reason, the wire harness 1a of the first modified example may have a configuration in which the corrugate tube 7 is not attached to the outside, unlike the above-described embodiment.

Figure 7:
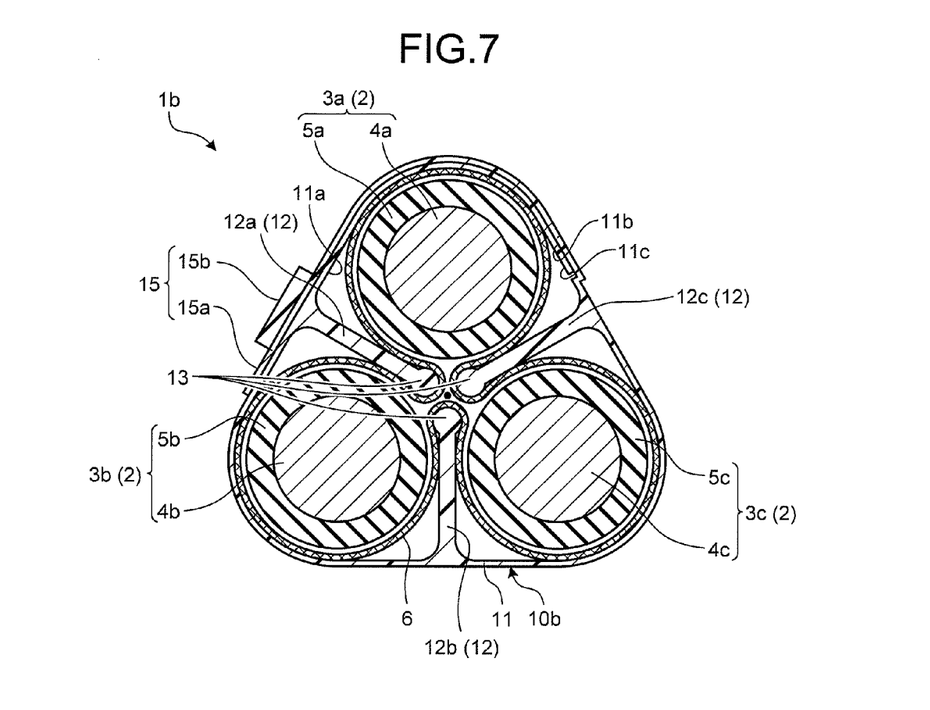
FIG. 7 is an axial cross-sectional view of a wire harness according to a second modified example of the embodiment.
Figure 8:
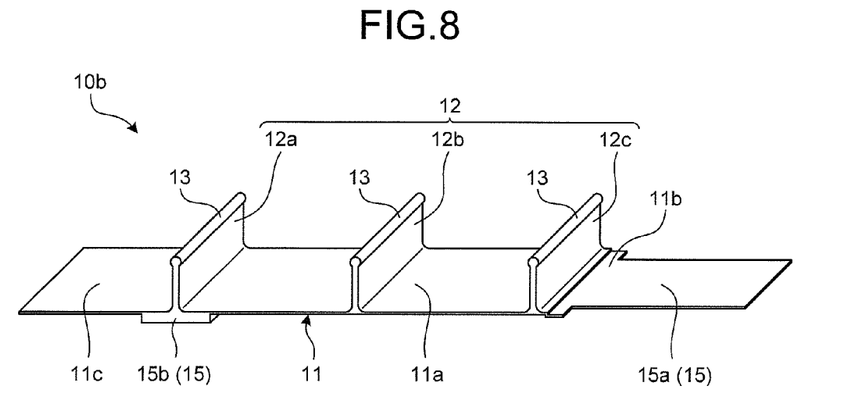
FIG. 8 is a perspective view illustrating a state where the electric wire holding member of FIG. 7 is exploded.

FIG. 7 is an axial cross-sectional view of a wire harness according to a second modified example of the embodiment. FIG. 8 is a perspective view illustrating a state where an electric wire holding member of FIG. 7 is exploded. In the above-described embodiment, as illustrated in FIG. 3, a configuration is exemplified in which the tape 14 is wound on the outer circumferential side of the electric wire holding member 10 so that the electric wire holding member 10 is fixed to the outer circumferential side of the electric wire portion 2. However, the electric wire holding member 10 may be fixed by a different method. For example, as illustrated in a wire harness 1b of a second modified example of FIG. 7, an electric wire holding member 10b includes a coupling band mechanism 15 and the electric wire holding member 10b is fixed to the outer circumferential side of the electric wire portion 2 by the coupling band mechanism 15. As illustrated in FIG. 8, the electric wire holding member 10b includes a band portion 15a, which is provided at one end in the long side direction so as to further extend in the long side direction from the step portion lib and a head portion 15b which is provided at the outer circumferential surface opposite to the inner circumferential surface 11a. The coupling band mechanism 15 includes the band portion 15a, and the head portion 15b. The coupling band mechanism 15 is one of known fixing methods. Here, when the band portion 15a, is inserted through a hole portion of the head portion 15b so as to be locked to a predetermined position, the band portion 15a, and the head portion 15b are coupled to each other.

As illustrated in FIG. 7, the electric wire holding member 10b is wound around the electric wire portion 2 so that the end 11c of the outer shape holding portion 11 in the long side direction abuts against the step portion 11b. Further, the band portion 15a, of the coupling band mechanism 15 is inserted through the hole portion of the head portion 15b so as to be locked to a predetermined position while completely surrounding the outer circumferential side of the electric wire portion 2 and being fixed to the circumferences of the electric wire portion 2 and the braided wire 6.

According to the invention, since the shield member is interposed between two adjacent electric wires in the circumferential direction among the electric wires of the electric wire portion of the wire harness, at least a part of a portion in which the electric wires directly face each other can be shielded by the shield member. Further, since the electric wire holding member is interposed, the electric wire portion and the shield member can be held at an appropriate positional relation. Accordingly, the radiation noise of the electric wire portion can be sufficiently reduced, thereby causing an effect that the surge voltage can be appropriately suppressed.

While the embodiment of the invention has been described, the above-described embodiment is provided merely as an example and is not intended to limit the scope of the invention. The above-described embodiment can be modified into various forms, and various omissions and substitutions can be made without departing from the spirit of the invention. The above-described embodiment and the modification are included in the scope of the invention and equivalent thereto as long as the embodiment and the modification are included in the scope or the spirit of the invention.

In the above-described embodiment, the inverter 20 and the motor 30 are exemplified as two components which are connected by the wire harness 1, 1a, or 1b of the above-described embodiment. However, the wire harness 1, 1a, or 1b may be used between other two components as long as a surge voltage can be generated therebetween.

Further, in the above-described embodiment, a configuration is exemplified in which the wire harness 1, 1a, or 1b of the embodiment is used as the power supply line connecting the three-phase AC type inverter 20 and the motor 30 to each other, but the inverter 20 and the motor 30 may be other than the three-phase AC type. That is, the wire harness 1, 1a, or 1b of the above-described embodiment may be, for example, a four-phase interconnection other than the three-phase interconnection. Here, the electric wire portion 2 may include three or more electric wires.

Further, in the above-described embodiment, the braided wire 6 is exemplified as a shield member that suppresses noise. However, for example, a metallic tape or a foil of copper or aluminum may be used as the shield member. Alternatively, the shield member may be obtained by the combination of these examples and the braided wire 6.

Further, each electric wire of the electric wire portion 2 may be a coaxial cable. That is, the shield member may be provided for each electric wire between the conductor portion and the coating portion around the conductor portion of each electric wire. Further, the electric wires of the electric wire portion 2 may extend in the same direction along the center axis line X1. Unlike the above-described embodiment, the electric wires may not be equally disposed in the circumferential direction about the center axis line X1.

Further, in the above-described embodiment, a configuration is exemplified in which the braided wire 6 as the shield member is grounded, but the braided wire may not be grounded.

What is claimed is:
1. A wire harness comprising:
an electric wire portion in which three or more electric wires are collected in a same direction, each of the electric wires including a conductor portion and an insulating portion coating an outer circumference of the conductor portion;
a shield member which surrounds an outer circumferential side of the electric wire portion in a bundle; and
an electric wire holding member which maintains an arrangement of the electric wires about a center axis line of the electric wire portion, wherein
the electric wire holding member includes
an outer shape holding portion which surrounds more outer circumferential side of the electric wire portion and the shield member, and
a plurality of shield member-shaped correction portions which protrudes in a direction of the center axis line from an inner circumferential surface of the outer shape holding portion between two adjacent electric wires of the electric wire portion along a circumferential direction about the center axis line, and which is formed so that the shield member approaches the center axis line side in relation to an outer circumferential tangential line connecting the conductor portions of two electric wires in a cross-section when viewed from an axial direction along the center axis line.
2. The wire harness according to claim 1, wherein
a front end of the shield member-shaped correction portion is circular in the cross-section.
3. The wire harness according to claim 2, wherein
the electric wires of the electric wire portion are circular in the cross-section and are disposed at a same interval in the circumferential direction, and
the shield member-shaped correction portion of the electric wire holding member is formed so that the shield member approaches the center axis line side in relation to a line connecting center points of two electric wires between the two adjacent electric wires of the electric wire portion in the circumferential direction in the cross-section.

4. The wire harness according to claim 2, wherein
the shield member is a braided wire obtained by weaving a thin metallic wire in a mesh shape.

5. The wire harness according to claim 2, wherein
the shield member is grounded.

6. The wire harness according to claim 2, wherein
the electric wire holding members are formed so as to surround a part of the electric wire portion in a longitudinal direction and are provided at a predetermined interval along the longitudinal direction of the electric wire portion.

7. The wire harness according to claim 1, wherein
the electric wires of the electric wire portion are circular in the cross-section and are disposed at a same interval in the circumferential direction, and
the shield member-shaped correction portion of the electric wire holding member is formed so that the shield member approaches the center axis line side in relation to a line connecting center points of two electric wires between the two adjacent electric wires of the electric wire portion in the circumferential direction in the cross-section.

8. The wire harness according to claim 7, wherein
the shield member-shaped correction portion of the electric wire holding member is formed so that the shield member approaches the center axis line from a gap between the two electric wires and surrounds the outer circumferential side of the electric wire of the electric wire portion in the cross-section.

9. The wire harness according to claim 8, wherein
the shield member is a braided wire obtained by weaving a thin metallic wire in a mesh shape.

10. The wire harness according to claim 8, wherein
the shield member is grounded.

11. The wire harness according to claim 8, wherein
the electric wire holding members are formed so as to surround a part of the electric wire portion in a longitudinal direction and are provided at a predetermined interval along the longitudinal direction of the electric wire portion.

12. The wire harness according to claim 7, wherein
the shield member is a braided wire obtained by weaving a thin metallic wire in a mesh shape.

13. The wire harness according to claim 7, wherein
the shield member is grounded.

14. The wire harness according to claim 7, wherein
the electric wire holding members are formed so as to surround a part of the electric wire portion in a longitudinal direction and are provided at a predetermined interval along the longitudinal direction of the electric wire portion.

15. The wire harness according to claim 1, wherein
the shield member is a braided wire obtained by weaving a thin metallic wire in a mesh shape.

16. The wire harness according to claim 1, wherein
the shield member is grounded.

17. The wire harness according to claim 1, wherein
the electric wire holding members are formed so as to surround a part of the electric wire portion in a longitudinal direction and are provided at a predetermined interval along the longitudinal direction of the electric wire portion.

18. The wire harness according to claim 1, wherein
the electric wire holding member is formed so as to surround an entire area of the electric wire portion in a longitudinal direction.

19. The wire harness according to claim 15, wherein
the shield member is grounded.

20. An electric wire holding member comprising:
an outer shape holding portion which surrounds more outer circumferential side of an electric wire portion and a shield member, the electric wire portion in which three or more electric wires being collected in a same direction, each of the electric wires including a conductor portion and an insulating portion coating an outer circumference of the conductor portion, the shield member surrounding an outer circumferential side of the electric wire portion in a bundle; and
a plurality of shield member-shaped correction portions which protrudes in a direction of a center axis line from an inner circumferential surface of the outer shape holding portion between two adjacent electric wires of the electric wire portion along a circumferential direction about the center axis line of the electric wire portion, and which is formed so that the shield member approaches the center axis line side in relation to an outer circumferential tangential line connecting the conductor portions of the two electric wires in a cross-section when viewed from an axial direction along the center axis line.

* * * * *